United States Patent
Okada

(10) Patent No.: US 10,818,376 B2
(45) Date of Patent: Oct. 27, 2020

(54) TESTING METHOD FOR SEMICONDUCTOR MEMORY

(71) Applicant: LAPIS Semiconductor Co., Ltd., Yokohama (JP)

(72) Inventor: Toshiharu Okada, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/515,626

(22) Filed: Jul. 18, 2019

(65) Prior Publication Data

US 2020/0027523 A1 Jan. 23, 2020

(30) Foreign Application Priority Data

Jul. 20, 2018 (JP) ................................. 2018-136809

(51) Int. Cl.
*G11C 29/50* (2006.01)
*G11C 29/00* (2006.01)
*G11C 11/4096* (2006.01)

(52) U.S. Cl.
CPC ........ *G11C 29/785* (2013.01); *G11C 11/4096* (2013.01); *G11C 29/50* (2013.01); *G11C 29/76* (2013.01); *G11C 2029/5004* (2013.01)

(58) Field of Classification Search
CPC ... G11C 29/785; G11C 11/4096; G11C 29/50; G11C 29/76; G11C 2029/5004
USPC ......................................................... 365/201
See application file for complete search history.

(56) References Cited

U.S. PATENT DOCUMENTS

| 2005/0232040 A1* | 10/2005 | An | G11C 29/50 365/201 |
| 2009/0052264 A1* | 2/2009 | Hong | G11C 29/50016 365/201 |
| 2009/0196108 A1* | 8/2009 | Kambara | G11C 29/846 365/189.05 |
| 2015/0287476 A1* | 10/2015 | Park | G11C 29/028 714/723 |

FOREIGN PATENT DOCUMENTS

JP 2008-108395 A 5/2008

\* cited by examiner

*Primary Examiner* — Harry W Byrne
(74) *Attorney, Agent, or Firm* — Rabin & Berdo, P.C.

(57) ABSTRACT

A testing method for a semiconductor memory includes determining which memory blocks are defective based on the number of defective cells in the block. The method includes determining whether the number of defective blocks exceeds a first threshold value and judging the semiconductor memory to be defective if the number of defective blocks is equal to or greater than the first threshold value. The method also includes comparing the number of defective blocks with a second threshold value equal to or less than the first threshold value and repeating the process of measuring and judging of the memory cells and memory blocks until the number of defective blocks is at least equal to the second threshold value, and then managing access to the defective blocks in a different manner from accesses to other blocks.

14 Claims, 5 Drawing Sheets

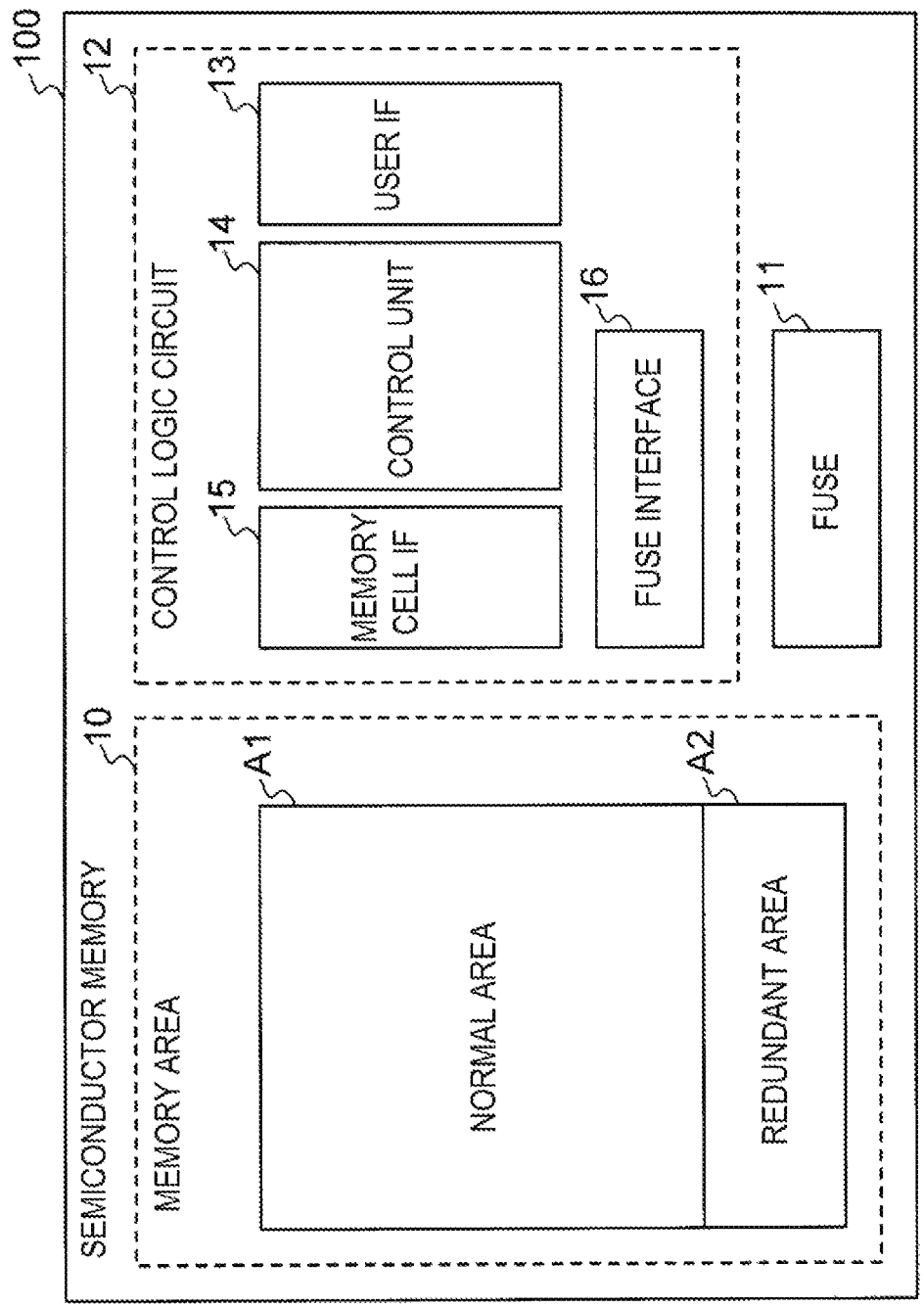

FIG. 5

TESTING METHOD FOR SEMICONDUCTOR MEMORY

BACKGROUND OF THE INVENTION

Technical Field

The present invention relates to a testing method for semiconductor memory.

Background Arts

In the manufacturing process of semiconductor memory such as dynamic random access memory (DRAM), a test to determine the quality of semiconductor memory is conducted in a wafer test process, which is performed on a wafer on which the semiconductor memory is formed (see Japanese Patent Application Laid-open Publication No. 2008-108395, for example). In this test, memory cells that do not satisfy prescribed operation conditions are deemed defective cells. A semiconductor memory has a redundant area in addition to a normal memory area, and cells in the redundant area (redundant cells) replace the memory cells deemed defective in the test. That is, when the address of a defective cell is to be accessed, the address of the redundant cell, instead of the defective cell, is accessed. If the number of defective cells exceeds the number of redundant cells, that semiconductor memory is deemed defective.

SUMMARY OF THE INVENTION

A plurality of chips cut out from a single wafer go through the test in the same wafer test process, and thus have the same performance in terms of the operation under a prescribed condition. However, under special conditions that are harsher than the conditions of the wafer test process such as an operation at low voltages or operation at low temperatures, the respective chips could be different in performance.

The present invention was made in view of this point, and an object thereof is to provide a testing method for semiconductor memory that makes it possible to manufacture semiconductor memory while suppressing the variations in performance.

A testing method for semiconductor memory of the present invention is a testing method for semiconductor memory to determine the quality of semiconductor memory having a plurality of memory blocks that each includes a plurality of memory cells, the method including: a first step of measuring an electrical characteristic of each of the plurality of memory cells of the plurality of memory blocks; a second step of identifying a defective cell among the plurality of memory cells by determining whether a measured value of the electrical characteristic of a memory cell satisfies a standard value or not; a third step of judging a memory block among the plurality of memory blocks to be a defective block if the memory block includes at least a prescribed number of defective cells; a fourth step of determining whether or not the number of defective blocks exceeds a first threshold value; a fifth step of recognizing the semiconductor memory as defective if the number of defective blocks exceeds the first threshold value; a sixth step of comparing the number of defective blocks with a second threshold value that is smaller than the first threshold value, if the number of detective blocks does not exceed the first threshold; a seventh step of repeating, if the number of defective memory blocks does not exceed the second threshold value, a series of steps including the first step, the second step, the third step, and the sixth step after making a change to measurement condition in measuring the electrical characteristic for each of the plurality of memory cells, until the number of detective blocks is judged to be equal to or greater than the second threshold value but smaller that the first threshold value; and an eighth step of managing accesses to the defective blocks in a different manner from accesses to other blocks that are not the defective blocks if the number of defective blocks is judged to be equal to or greater than the second threshold value but smaller than the first threshold value in the sixth step or the seventh step.

A testing method for semiconductor memory of the present invention is a testing method for semiconductor memory to determine quality of semiconductor memory having a plurality of memory blocks that each includes a plurality of memory cells, the method including: a first step of measuring an electrical characteristic of each of the plurality of memory cells of the plurality of memory blocks; a second step of identifying a defective cell among the plurality of memory cells by determining whether a measured value of the electrical characteristic of a memory cell satisfies a standard value or not; a third step of judging a memory block among the plurality of memory blocks to be a defective block if the memory block includes at least a prescribed number of defective cells; a fourth step of determining whether or not the number of defective blocks exceeds a first threshold; a fifth step of recognizing the semiconductor memory as defective if the number of defective blocks exceeds the first threshold value; a sixth step of comparing the number of defective blocks with a second threshold value that is smaller than the first threshold value, if the number of detective blocks does not exceed the first threshold; a seventh step of turning off the semiconductor memory and turning it back on, if the number of defective memory blocks is smaller than the second threshold value, and selecting defective blocks again based on a change in electrical charges accumulated in each of the plurality of memory cells so that the number of defective blocks reaches the second threshold value; an eighth step of managing accesses to the defective blocks in a different manner from accesses to other blocks than those defective blocks if the number of defective blocks is judged to be equal to or greater than the second threshold value but smaller than the first threshold value in the sixth step or the seventh step.

A testing method for a semiconductor memory of the present invention is a testing method for semiconductor memory having a plurality of memory blocks that each includes a plurality of memory cells, a plurality of redundant blocks that each includes a plurality of redundant cells, and a fuse block having a plurality of fuses each memorizing one of the plurality of redundant blocks and one of the plurality of memory blocks as a pair to be replaced with each other, the method including: a first step of measuring an electrical characteristic of each of the plurality of memory cells of the plurality of memory blocks, identifying a defective cell among the plurality of memory cells by determining whether a measured value of the electrical characteristic of a memory cell satisfies a standard value or not, and judging a memory block among the plurality of memory blocks to be a defective block if the memory block includes at least a prescribed number of defective cells; a second step of determining whether the number of defective blocks exceeds a first threshold value or not; a third step of recognizing the semiconductor memory as defective if the number of defective blocks exceeds the first threshold value; a fourth step of comparing the number of defective blocks with a second threshold value that is smaller than the first threshold value if the number of detective blocks does not exceed the first threshold; a fifth step of repeating, if the number of defective memory blocks is judged smaller than the second threshold value, a series of steps including the first step, the second step, and the fourth step after making a change to a measurement condition in measuring the electrical characteristic for each of the plurality of memory cells until the number of detective blocks is judged to be equal to or greater than the second threshold value but smaller that the first threshold value; and a sixth step of cutting off one of the fuses in the fuse block so that the redundant block is accessed instead of the defective block, if the number of defective blocks is judged to be equal to or greater than the second threshold value but smaller than the first threshold value in the fourth step or the fifth step.

A testing method for a semiconductor memory of the present invention is A testing method for semiconductor memory having a plurality of memory blocks that each includes a plurality of memory cells, a plurality of redundant blocks that each includes a plurality of redundant cells, and a fuse block having a plurality of fuses each memorizing one of the plurality of redundant blocks and one of the plurality of memory blocks as a pair to be replaced with each other, the method including: a first step of measuring an electrical characteristic of each of the plurality of memory cells of the plurality of memory blocks, identifying a defective cell among the plurality of memory cells by determining whether a measured value of the electrical characteristic of a memory cell satisfies a standard value or not, and judging a memory block among the plurality of memory blocks to be a defective block if the memory block includes at least a prescribed number of defective cells; a second step of determining whether the number of defective blocks exceeds a first threshold value or not; a third step of recognizing the semiconductor memory as defective if the number of defective blocks exceeds the first threshold; a fourth step of comparing the number of defective blocks with a second threshold value that is smaller than the first threshold value if the number of detective blocks does not exceed the first threshold; a fifth step of turning off the semiconductor memory and turning it back on, if the number of defective memory blocks is smaller than the second threshold value, and selecting defective blocks again based on a change in electrical charges accumulated in each of the plurality of memory cells so that the number of defective blocks reaches the second threshold value; a sixth step of cutting off one of the fuses in the fuse block so that the redundant block is accessed instead of the defective block, if the number of defective blocks is judged to be equal to or greater than the second threshold value but smaller than the first threshold value in the fourth step or the fifth step.

In accordance with the testing method for semiconductor memory of the present invention, it is possible to manufacture semiconductor memory having a smaller degree of variations in performance.

BRIEF DESCRIPTION OF THE DRAWINGS

FIG. 1 is a block diagram illustrating the configuration of semiconductor memory according to an embodiment of the present invention.

FIG. 5 is a diagram schematically illustrating the state of a memory cell in the process of turning the power on and off in the test of an embodiment.

DETAILED DESCRIPTION OF THE INVENTION

Figure 2A:
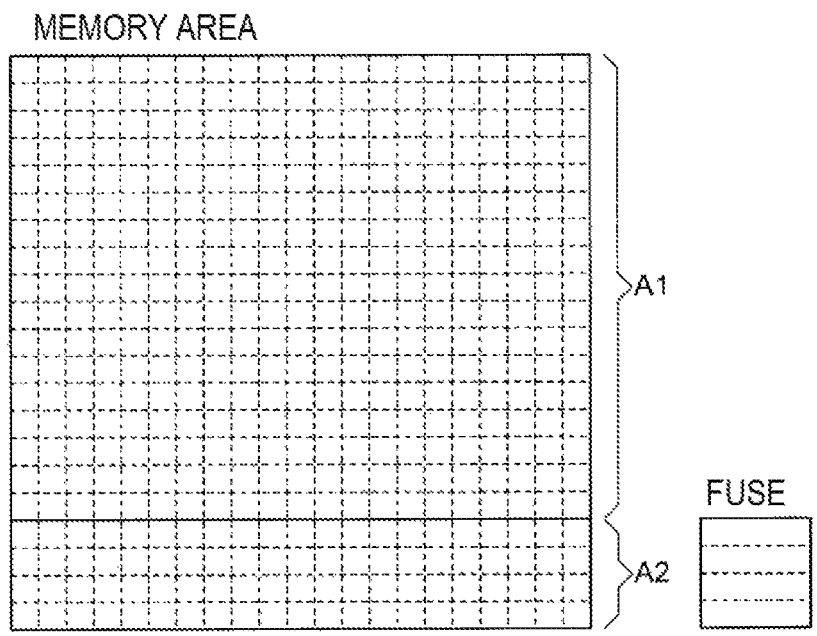
FIG. 2A is a diagram illustrating the configuration of a memory cell according to an embodiment of the present invention.

Preferred embodiments of the present invention will be described in detail below. In the descriptions of respective embodiments below and appended diagrams, the same reference characters are given to parts that are substantially the same as each other or equivalent to each other.

Embodiment 1

FIG. 1 is a block diagram illustrating the configuration of semiconductor memory 100 of a first embodiment. The semiconductor memory 100 is constituted of a DRAM (dynamic random access memory), for example. The semiconductor memory 100 includes a memory area 10, a fuse 11, and a control logic circuit 12.

The memory area 10 includes a normal area A1 and a redundant area A2. The normal area A1 is a memory area made up of memory cells to be accessed in a regular memory access process. The redundant area A2 is a memory area including redundant blocks that replace blocks in the normal area A1 which include more defective cells than a prescribed number (referred to throughout the specification as defective blocks).

The fuse 11 stores the address of each defective block as a "redundant address" in association with the address of a redundant block to be replaced with. The fuse 11 is constituted of a plurality of fuse elements, and stores the information of redundant address by cutting off the fuse elements. An example of a fuse 11 is programmable read only memory (PROM) by which a setting of bits is set by a fuse or antifuse to store data that is read-only, or that cannot be re-written.

FIG. 2A is a diagram schematically illustrating the configuration of the memory area 10 and the fuse 11. Each of the normal area A1 and the redundant area A2 of the memory area 10 is constituted of a plurality of cells. In this embodiment, each row of the cells in the normal area A1 is assigned with an address. In the semiconductor memory 100 of this embodiment, the normal area A1 and the redundant area A2 have the same number of columns, and one row of redundant cells replaces one row of normal cells. That is, in the normal area A1, one row constitutes one defective block, and in the redundant area A2, one row constitutes one redundant block. The fuse 11 has a memory area corresponding to each row (or each redundant block) of the redundant area A2.

Figure 2B:
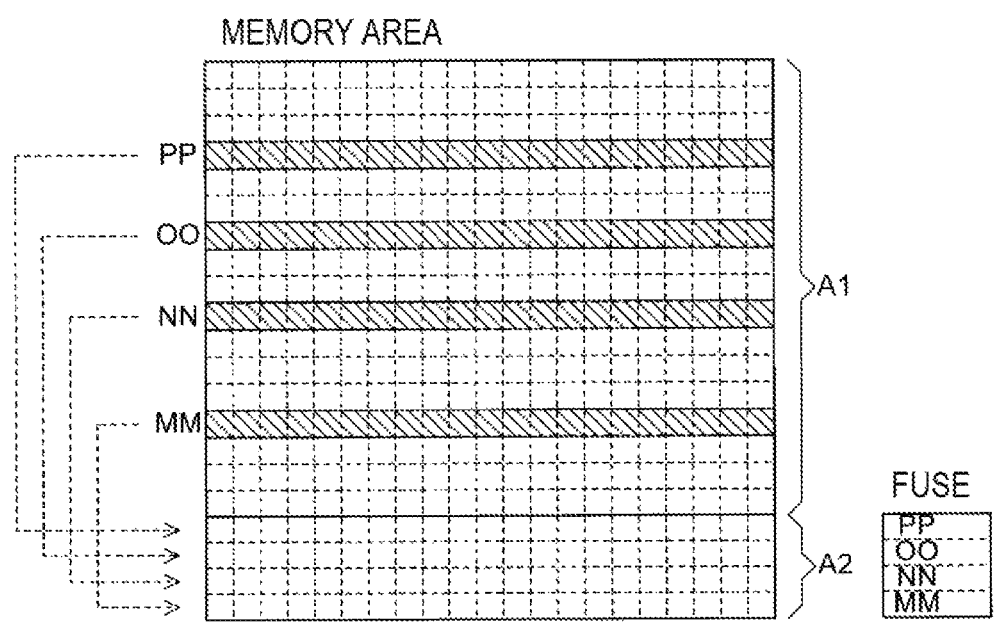
FIG. 2B is a diagram schematically illustrating a state in which a redundant area is used.

FIG. 2B is a diagram schematically illustrating a state in which the redundant area is used in the semiconductor memory of this embodiment. In this example, the blocks with respective addresses PP, OO, NN and MM in the normal area A1 are defective blocks, and indicated with hatching.

In the fuse 11, PP, OO, NN, and MM, which are the addresses of the defective blocks, are stored as the redundant addresses. As a result, the respective blocks with addresses PP, OO, NN, and MM in the normal area A1 are replaced with the blocks of the first row, second row, third row, and fourth row in the redundant area A2, respectively. While FIGS. 2A and 2B show a fuse 11 with fuse blocks—or address storage locations—for purposes of illustration, embodiments of the invention encompass any number of fuse blocks.

Returning to FIG. 1, the control logic circuit 12 includes a user interface (IF) 13, a control unit 14, a memory cell IF 15, and a fuse interface 16.

The user IF 13 is an interface unit that receives command signals from outside the semiconductor memory 100 for writing data into the memory area 10, reading out data from the memory area 10, and the like. The control unit 14 controls access to the memory area 10 for data writing, reading, and the like, in accordance with the command signals supplied via the user IF 13. The memory cell IF 15 is an interface unit that accesses the memory area 10 as a result of the control by the control unit 14.

The fuse interface 16 accesses the fuse 11 to determine the location in the memory area to be accessed by the control unit 14. For example, the fuse interface 16 accesses the fuse 11 to confirm if the access destination block in the memory area specified by the user IF 13 is a block to be replaced with a redundant block. If the access destination block is a block to be replaced with a redundant block, the memory cell IF 15 accesses the redundant block, and if not, the memory cell IF 15 accesses a memory area specified by the user IF 13.

Figure 3:
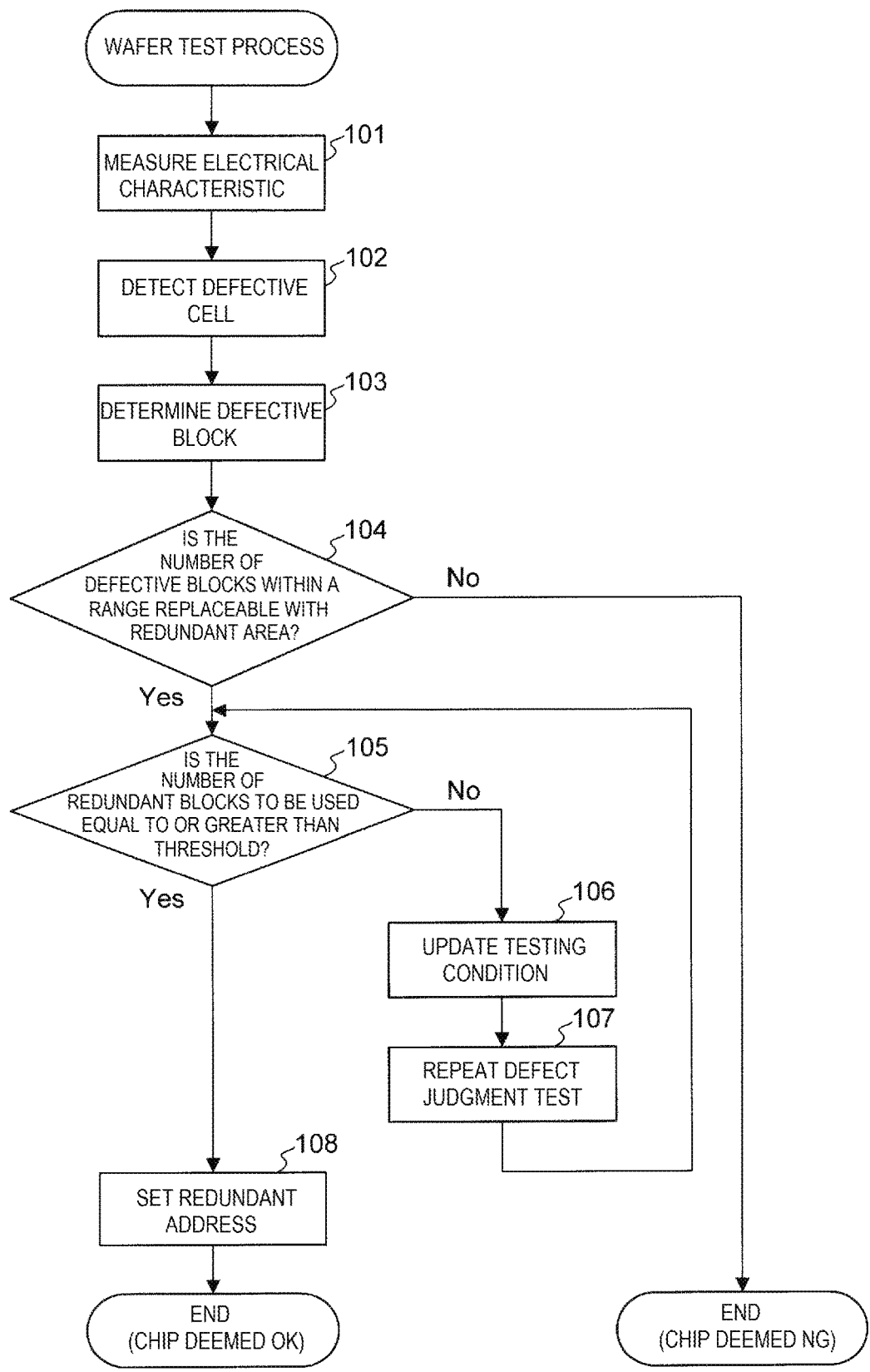
FIG. 3 is a flowchart illustrating the process routine of a test for semiconductor memory of one embodiment.

The replacement address is written in the fuse 11 in the wafer test process during the manufacturing process of the semiconductor memory 100. In the wafer test process, a test is performed to determine the quality of the semiconductor memory 100. The test process will be explained with reference to the flowchart of FIG. 3.

First, each of the plurality of chips formed on a wafer undergoes the defect judgment test to detect a defective cell. In the defect judgment test, the electrical characteristic of each memory cell such as the current characteristic or voltage characteristic is measured at the time of data writing, data reading, and data refreshing, for example (step 101). By comparing the measured value with the standard value, judgment is made on whether the memory cell is a defective cell or not (step 102). A memory block (row) having more defective cells than a prescribed number is deemed a defective block (step 103).

Next, it is determined whether the number of memory blocks deemed defective is within a range that can be replaced with the redundant area or not (step 104). For example, it is determined whether or not the number of memory blocks deemed defective in the normal area A1 does not exceed the number of redundant blocks included in the redundancy area A2.

If the number of defective blocks exceeds the range that can be replaced with the redundant area A2 (step 104: No), the chip including those defective blocks is deemed NG, and the test for the chip is ended.

On the other hand, if the number of defective blocks does not exceed the range that can be replaced with the redundant area A2 (step 104: Yes), it is determined whether or not the number of redundant blocks to be used exceeds or is equal to a threshold value (step 105).

If the number of redundant blocks to be used is smaller than the threshold value (step 105: No), the testing condition is updated (step 106), and the defect judgment test is performed again (step 107).

For example, because the natural discharge time of the electrical charge stored in the memory cell differs in each memory cell, the time interval of the refresh process for reinjecting the charge into the memory cell may be made longer as a new test condition in step 106. With this change, cells, which were previously deemed non-defective, may be deemed defective in a subsequent test (step 107) if the charge reinjection is not completed within the natural discharge time after the time interval of the refresh process is adjusted in step 106.

Further, because DRAM has a great temperature dependency and has a characteristic that the natural discharge of the memory element is accelerated when the temperature is high, the temperature of the test environment may be increased as a new test condition in step 106. With this change, cells which were previously deemed non-defective may be deemed defective in a subsequent test (step 107) if the charge reinjection is not completed within the natural discharge time after the temperature of the test environment is increased in step 106.

Another new test condition which could be adjusted in step 106 is to reduce the voltage applied to the word line connected to the memory cell, taking advantage of the characteristic that the voltage read out from each memory cell varies. This lowers the gate voltage of the transistor that constitutes the memory cell, and the read-out voltage from the memory cell decreases. As a result, some cells would not reach the readable voltage even after the amplification of a sense amp, and those cells would be deemed defective.

Another new test condition which could be adjusted in step 106 is to reduce the voltage of the back gate of the transistor that constitutes the memory cell so that the threshold voltage of the transistor is higher, taking advantage of the characteristic that the voltage read out from each memory cell varies. This causes the read-out voltage of some cells to be lower than the threshold value, and those cells are deemed defective.

After another round of the defect judgment test in step 107, the process returns to step 105 to determine whether or not the number of redundant blocks to be used reaches the threshold value.

If the number of redundant blocks to be used reaches the threshold value in step 105 (step 105: Yes), the address of each defective block is set in the fuse 11 as the redundant address (step 108). Then, as this chip is deemed OK, the test is ended. In embodiments of the invention, the threshold value may be more than one, and equal to or less than the number of fuse blocks in the fuse 11. In one embodiment, the threshold value is more than one and less than the number of fuse blocks in the fuse 11. In one embodiment, the threshold is a number representing at least half of the fuse blocks in the fuse 11. In one embodiment, the threshold is in a range having, at a lower end, a number representing at least half of the fuse blocks in the fuse 11, and, at an upper end, a number equal to or less than the total number of fuse blocks in the fuse 11.

As described above, in the testing method of this embodiment, detection of defective cells and determination of defective blocks are performed multiple times with different test conditions in a wafer test process so that at least a prescribed number of defective blocks are replaced with redundant blocks. This way, the memory blocks that do not meet the reference value under the updated test conditions are deemed defective blocks, and are replaced with the redundant blocks. That is, the addresses of a prescribed number or more of memory blocks are overwritten, and the access thereto is managed in a manner different from the normal memory blocks.

With this method, it is possible to manufacture semiconductor memory with a smaller degree of variations in performance in special environments, such as operation in a high temperature environment and operation when the voltage applied to the word line is made lower.

Also, with this method, because at least a prescribed number of memory blocks are replaced with the redundant blocks, at least a prescribed number of fuse elements are cut off in the fuse 11. When the fuse element is cut off, the current does not flow through the cut-off area, and therefore, the current consumption is reduced as compared with the case in which the fuse is not cut off. Thus, the more fuse elements are cut off, the greater reduction in current consumption is achieved in the entire semiconductor memory 100. Considering the reduction in current consumption in the semiconductor memory as a whole, the entire redundant area may be used for replacement.

By performing the test repeatedly under various severe conditions, it is possible to make semiconductor memory having optimal performance, taking into account the variations of respective memory cells.

In addition, by performing the test multiple times under different conditions and replacing defective blocks with redundant blocks, it is possible to create a plurality of semiconductor memories with various different performances from one wafer.

Embodiment 2

Next, another embodiment of the present invention will be explained. The testing method of this embodiment differs from the testing method of the first embodiment in that a defective block to be replaced with a redundant block is selected by turning off the semiconductor memory 100 and then turning it back on, instead of repeating the test to determine defective cells.

One of the characteristics of DRAM is that when the power is turned off and then turned back on, electrical charges are accumulated in some of the memory cells with an increase in cell plate potential, which is the internal power source. Those charges vary depending on the capacity of each memory cell, and can therefore be read out as random data for each chip before actual data is written in DRAM.

Figure 4:
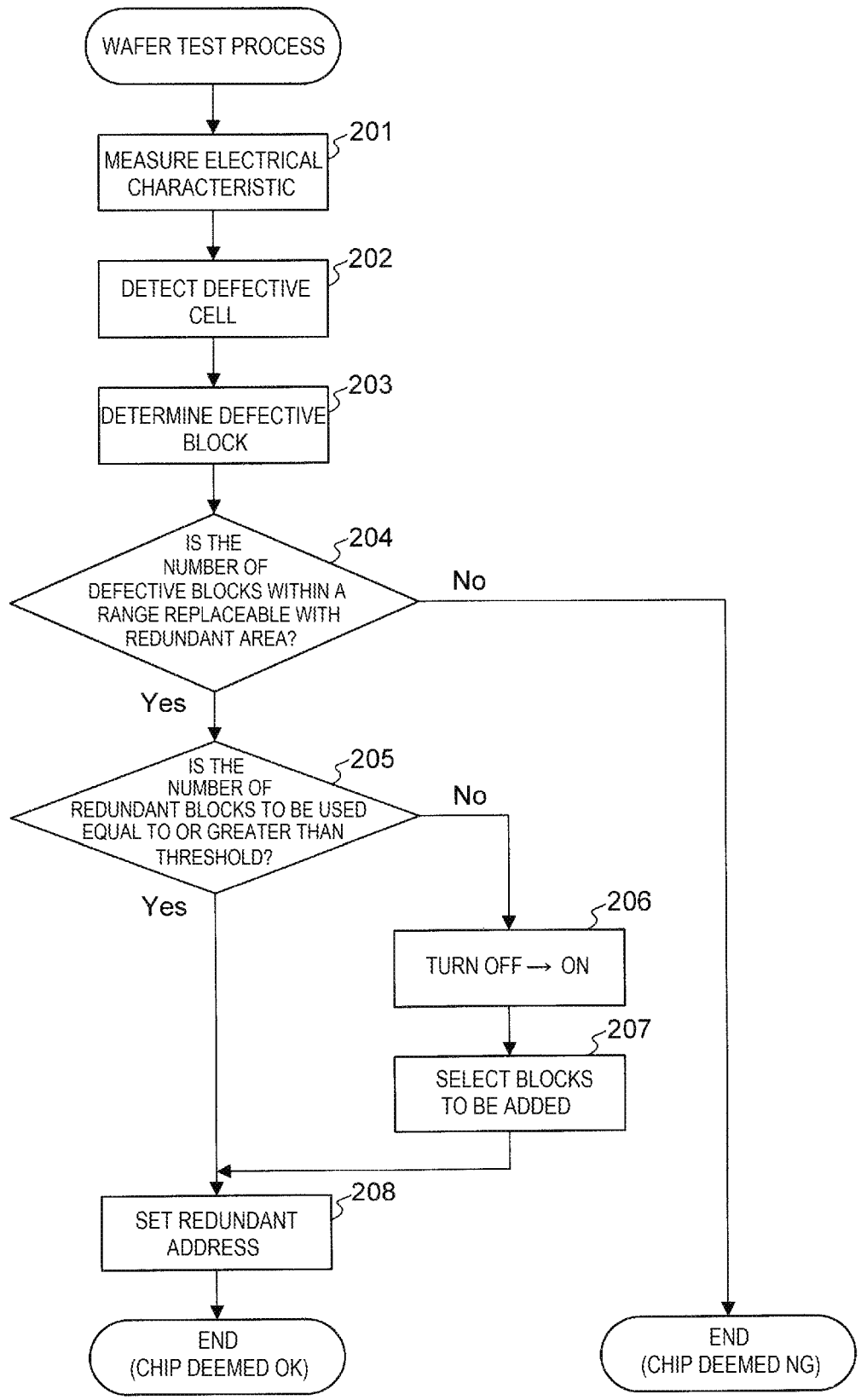
FIG. 4 is a flowchart illustrating the process routine of a test for semiconductor memory of another embodiment.

The test process of this embodiment will be explained with reference to the flowchart of FIG. 4.

First, each of the plurality of chips formed on a wafer undergoes the defect judgment test to detect defective cells. In a manner similar to the first embodiment, in the defect judgment test, an electrical characteristic of each memory cell such as the current characteristic or voltage characteristic is measured (step 201), and by comparing the measured value with the standard value, judgment is made on whether the memory cell is a defective cell or not (step 202). Then, a memory block (row) having more defective cells than a prescribed number is deemed a defective block (step 203)

Next, it is determined whether or not the number of memory blocks deemed detective is within the range that can be replaced with the redundant area, or in other words, whether or not the number of defective memory blocks does not exceed the number of redundant blocks included in the redundancy area A2 (step 204).

If the number of defective blocks exceeds the range that can be replaced with the redundant area A2 (step 204: No), the chip including those defective blocks is deemed NG, and the test for the chip is ended.

On the other hand, if the number of defective blocks does not exceed the range that can be replaced with the redundant area A2 (step 204: Yes), it is determined whether or not the number of redundant blocks to be used exceeds a threshold value (step 205).

If the number of redundant blocks to be used does not exceed the threshold value (step 205: No), the semiconductor memory 100 is turned off and then turned back on (step 206). Then the memory blocks to be added as defective blocks are selected based on the change in electrical charge state of the memory cells (step 206).

Figure 5:
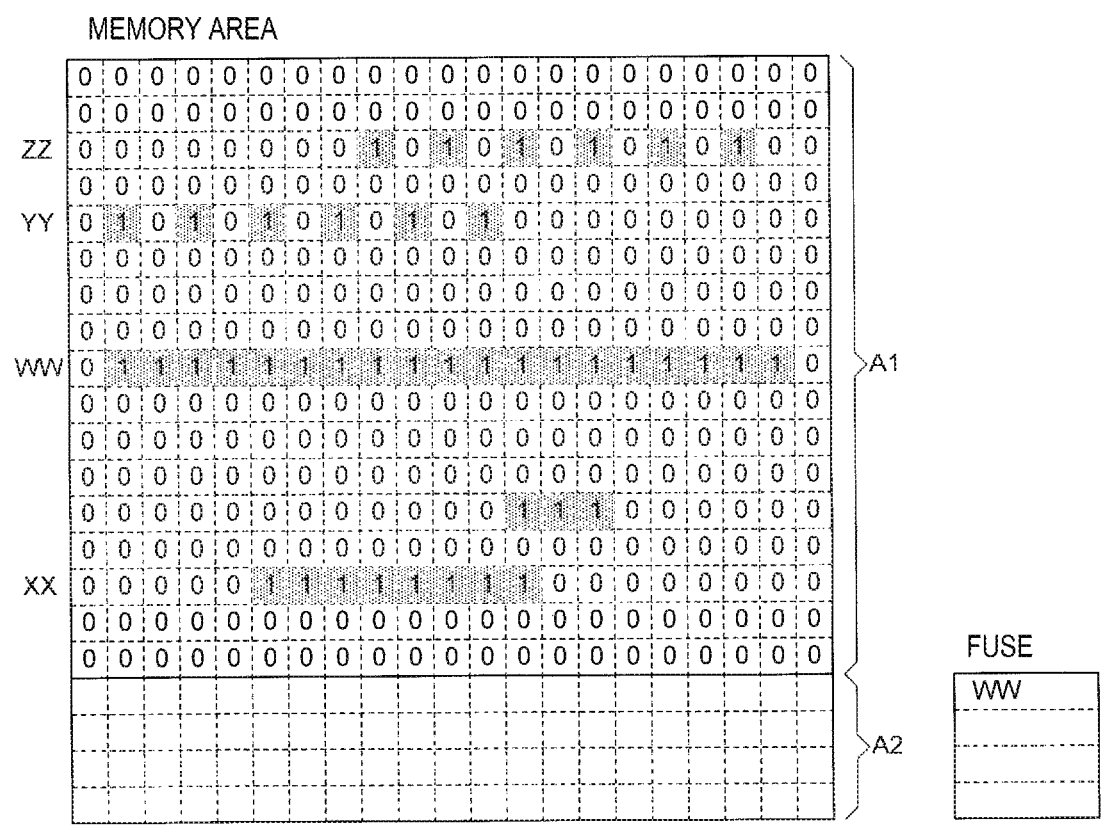

FIG. 5 is a diagram schematically showing the state of electrical charges in memory cells after the semiconductor memory 100 is turned off and then turned back on. In the diagram, cells in which the electrical charge has not changed from the initial value are denoted with "0," and cells in which the electrical charge has changed are denoted with "1." Also, the diagram shows the state in which the block with the address "WW" in the normal area A1 is deemed a defective block in the defect judgment test from step 201 to step 203.

For example, when the number of redundant blocks to be used is set to "4," three blocks other than the block with the address "WW" need to be selected from the normal area A1. To meet this requirement, the memory blocks in which the charge has changed from "0" to "1" are selected as blocks to be replaced by the redundant area. In FIG. 5, the addresses "XX," "YY," and "ZZ" are selected as the blocks to be replaced.

Returning to FIG. 4, if the number of redundant blocks to be used is equal to or greater than the threshold value in step 205 (step 205: Yes), or if the additional memory blocks are selected as the defective blocks in step 207, the addresses of the defective blocks are set in the fuse 11 as the redundant address (step 208). Then, as this chip is deemed OK, and the test is ended.

As described above, in the testing method of this embodiment, the semiconductor memory 100 is turned off and then turned back on and defective blocks are selected based on a change in electrical charge state of respective memory cells in the wafer test process, so that at least a prescribed number of defective blocks are replaced with redundant blocks. This way, it is possible to make sure that the usage of redundant area is always meeting the predetermined condition in the stage of wafer test process.

With the testing method of this embodiment, the step of repeating a defect judgment test after updating the conditions as in the first embodiment is not necessary, and therefore, it is possible to perform the test in a simpler and quicker manner.

Also, in the testing method of this embodiment as well, because at least a prescribed number of memory blocks are replaced with the redundant blocks, at least a prescribed number of fuse elements are cut off in the fuse 11. Because this suppresses the amount of current that flows through the fuse elements that are not cut off, the more fuse elements are cut off, the greater reduction in current consumption is achieved in the entire semiconductor memory 100. Considering the reduction in current consumption in the semiconductor memory as a whole, the entire redundancy area may be used for replacement.

The present invention is not limited to the embodiments described above. For example, in the first embodiment illustrated in FIG. 3, the examples of changing the refreshing time interval, the temperature, the gate voltage, and the threshold voltage were described for changing the condition before performing the defect judgment test again. However, the present invention is not limited to these examples, and other conditions may be changed for another round of the defect judgment test.

Also, each of those changes in testing conditions in the first embodiment may be made independently of each other, or may be combined. By combining a plurality of testing conditions, new defective cells can be detected more efficiently, which reduces the time required for the testing process.

In the second embodiment, described above, the semiconductor memory 100 is turned off and then turned back on in the wafer testing process, and the additional memory blocks to be replaced with the redundant blocks are selected based on the electrical charge state of the memory cells. However, this process may be performed on a finished chip.

In the embodiments described above, the case in which the semiconductor memory 100 is DRAM was explained, but those embodiments are applicable to different types of memory that are configured to replace a defective area with a redundant area in a manner similar to DRAM.

DESCRIPTIONS OF REFERENCE CHARACTERS

100 Semiconductor Memory
10 Memory Area
A1 Normal Area
A2 Redundant Area
11 Fuse
12 Control Logic Circuit
13 User IF
14 Control Unit
15 Memory Cell IF
16 Fuse Interface

What is claimed is:

1. A testing method for semiconductor memory having a plurality of memory blocks that each includes a plurality of memory cells, the method comprising:
measuring an electrical characteristic of each of the plurality of memory cells of the plurality of memory blocks;
identifying a defective cell among the plurality of memory cells by determining whether a measured value of the electrical characteristic of a memory cell satisfies a standard value, and determining that the memory cell is the defective cell based on determining that the measured value of the electrical characteristic of the memory cell does not satisfy the standard value;
judging a memory block among the plurality of memory blocks to be a defective block if the memory block includes at least a prescribed number of defective cells;
determining whether a number of defective blocks exceeds a first threshold value;
recognizing the semiconductor memory as defective if the number of defective blocks exceeds the first threshold value;
comparing the number of defective blocks with a second threshold value that equal to or less than the first threshold value;
based on determining that the number of defective blocks is smaller than the second threshold value, changing a testing condition and repeating a series of steps including measuring the electrical characteristic of each of the plurality of memory cells, identifying a defective cell among the plurality of memory cells, judging a memory block among the plurality of memory blocks to be a defective block, and comparing the number of defective blocks with the second threshold value, until the number of detective blocks is judged to be equal to or greater than the second threshold value and equal to or less than the first threshold value; and programming the semiconductor memory to route access requests to addresses corresponding to the defective blocks to a different location in the semiconductor memory than requests to addresses of other blocks that are not the defective blocks.

2. The testing method for semiconductor memory according to claim 1, wherein said measuring of the electrical characteristic includes measuring a read-out voltage in reading out data from the plurality of memory cells, and
wherein said change to a testing condition includes changing a time interval to refresh the plurality of memory cells.

3. The testing method for semiconductor memory according to claim 1, wherein said change to a testing condition includes changing a temperature of the plurality of memory cells during measurement of the electrical characteristic.

4. The testing method for semiconductor memory according to any one of claim 1, wherein each of the plurality of memory cells is a transistor, and
wherein said change to a testing condition includes changing a voltage to be applied to a gate of the transistor.

5. The testing method for semiconductor memory according to any one of claim 1, wherein each of the plurality of memory cells is a transistor, and
wherein said change to a measurement condition includes changing a threshold voltage of a gate of the transistor.

6. The testing method for semiconductor memory according to claim 1, wherein the semiconductor memory includes a normal area and a redundant area,
wherein the measuring of the electrical characteristic of each of the plurality of memory cells is performed in the normal area,
wherein programming the semiconductor memory to route access requests to addresses corresponding to the defective blocks to a different location in the semiconductor memory than requests to addresses of other blocks that are not the defective blocks includes assigning memory blocks of the redundant area to replace the defective blocks of the normal area, and
wherein the first threshold value is equal to a number of memory blocks in the redundant area.

7. The testing method for semiconductor memory according to claim 6, wherein the second threshold value is at least one.

8. The testing method for semiconductor memory according to claim 6, wherein the second threshold value is greater than one and less than the number of memory blocks in the redundant area.

9. The testing method for semiconductor memory according to claim 6, wherein the second threshold value is equal to the number of memory blocks in the redundant area.

10. The testing method for semiconductor memory according to claim 6, wherein the semiconductor memory includes a fuse having a plurality of fuse blocks, and
assigning memory blocks of the redundant area to replace the defective blocks of the normal area includes cutting off fuse elements in the plurality of fuse blocks, such that the plurality of fuse blocks correspond to the addresses of the defective blocks.

11. A testing method for semiconductor memory having a plurality of memory blocks that each includes a plurality of memory cells, the method comprising:
measuring an electrical characteristic of each of the plurality of memory cells of the plurality of memory blocks;
identifying a defective cell among the plurality of memory cells by determining whether a measured value of the electrical characteristic of a memory cell satisfies a standard value, and determining that the memory cell is the defective cell based on determining that the measured value of the electrical characteristic of the memory cell does not satisfy the standard value;

judging a memory block among the plurality of memory blocks to be a defective block if the memory block includes at least a prescribed number of defective cells, a sum of the defective blocks defining a number of first defective blocks;

determining whether or not the number of first defective blocks exceeds a first threshold value;

recognizing the semiconductor memory as defective if the number of first defective blocks exceeds the first threshold value;

comparing the number of first defective blocks with a second threshold value that is less than or equal to the first threshold value;

based on determining that the number of first defective blocks is smaller than the second threshold value, turning off the semiconductor memory, then turning on the semiconductor memory, and then selecting a number of second defective blocks based on a change in electrical charges accumulated in each of the plurality of memory cells when the semiconductor memory was turned on, the number of second defective blocks selected so that a total number of the first defective blocks and the second defective blocks equals the second threshold value; and programming the semiconductor memory to route access to the first and second defective blocks in a different manner from access to other blocks than the first defective blocks and the second defective blocks.

12. The testing method for semiconductor memory according to claim 6, wherein programming the semiconductor memory includes replacing access to addresses of the defective blocks with access to addresses of other memory blocks other than the plurality of memory blocks.

13. A testing method for semiconductor memory having a plurality of memory blocks that each includes a plurality of memory cells, a plurality of redundant blocks that each includes a plurality of redundant cells, and a fuse block having a plurality of fuses each corresponding to one of the plurality of redundant blocks, the method comprising:

measuring an electrical characteristic of each of the plurality of memory cells of the plurality of memory blocks, identifying a defective cell among the plurality of memory cells by determining whether a measured value of the electrical characteristic of a memory cell satisfies a standard value, and determining that the memory cell is the defective cell based on determining that the measured value of the electrical characteristic of the memory cell does not satisfy the standard value;

judging a memory block among the plurality of memory blocks to be a defective block if the memory block includes at least a prescribed number of defective cells;

determining whether a number of defective blocks exceeds a first threshold value;

recognizing the semiconductor memory as defective if the number of defective blocks exceeds the first threshold value;

comparing the number of defective blocks with a second threshold value that is equal to or less than the first threshold value;

based on determining that the number of defective memory blocks is less than the second threshold value, changing a testing condition and repeating a series of steps including measuring the electrical characteristic of each of the plurality of memory cells, identifying a defective cell among the plurality of memory cells, judging a memory block among the plurality of memory blocks to be a defective block, and comparing the number of defective blocks with the second threshold value, until the number of defective blocks is judged to be equal to or greater than the second threshold value and equal to or less than the first threshold value; and cutting off fuse elements of a plurality of fuse blocks so that, for each of the plurality of fuse blocks, a corresponding redundant block is accessed instead of a corresponding defective block indicated by the fuse elements of the fuse block.

14. A testing method for semiconductor memory having a plurality of memory blocks that each includes a plurality of memory cells, a plurality of redundant blocks that each includes a plurality of redundant cells, and a fuse block having a plurality of fuses each memorizing one of the plurality of redundant blocks and one of the plurality of memory blocks as a pair to be replaced with each other, the method comprising:

measuring an electrical characteristic of each of the plurality of memory cells of the plurality of memory blocks;

identifying a defective cell among the plurality of memory cells by determining whether a measured value of the electrical characteristic of a memory cell satisfies a standard value or not, and determining that the memory cell is the defective cell based on determining that the measured value of the electrical characteristic of the memory cell does not satisfy the standard value;

judging a memory block among the plurality of memory blocks to be a defective block if the memory block includes at least a prescribed number of defective cells, a sum of the defective blocks defining a number of first defective blocks;

determining whether the number of first defective blocks exceeds a first threshold value;

recognizing the semiconductor memory as being defective if the number of defective blocks exceeds the first threshold value;

comparing the number of defective blocks with a second threshold value that is less than or equal to the first threshold value;

based on determining that the number of defective blocks is less than the second threshold value, turning off the semiconductor memory and then turning on the semiconductor memory, and selecting a number of second defective blocks based on a change in electrical charges accumulated in each of the plurality of memory cells so that a total number of first and second defective blocks reaches the second threshold value;

cutting off fuse elements in a plurality of fuse blocks so that, for each of the plurality of fuse blocks, a corresponding redundant block is accessed instead of a corresponding defective block indicated by the fuse elements of the fuse block.

* * * * *